Figure 1:
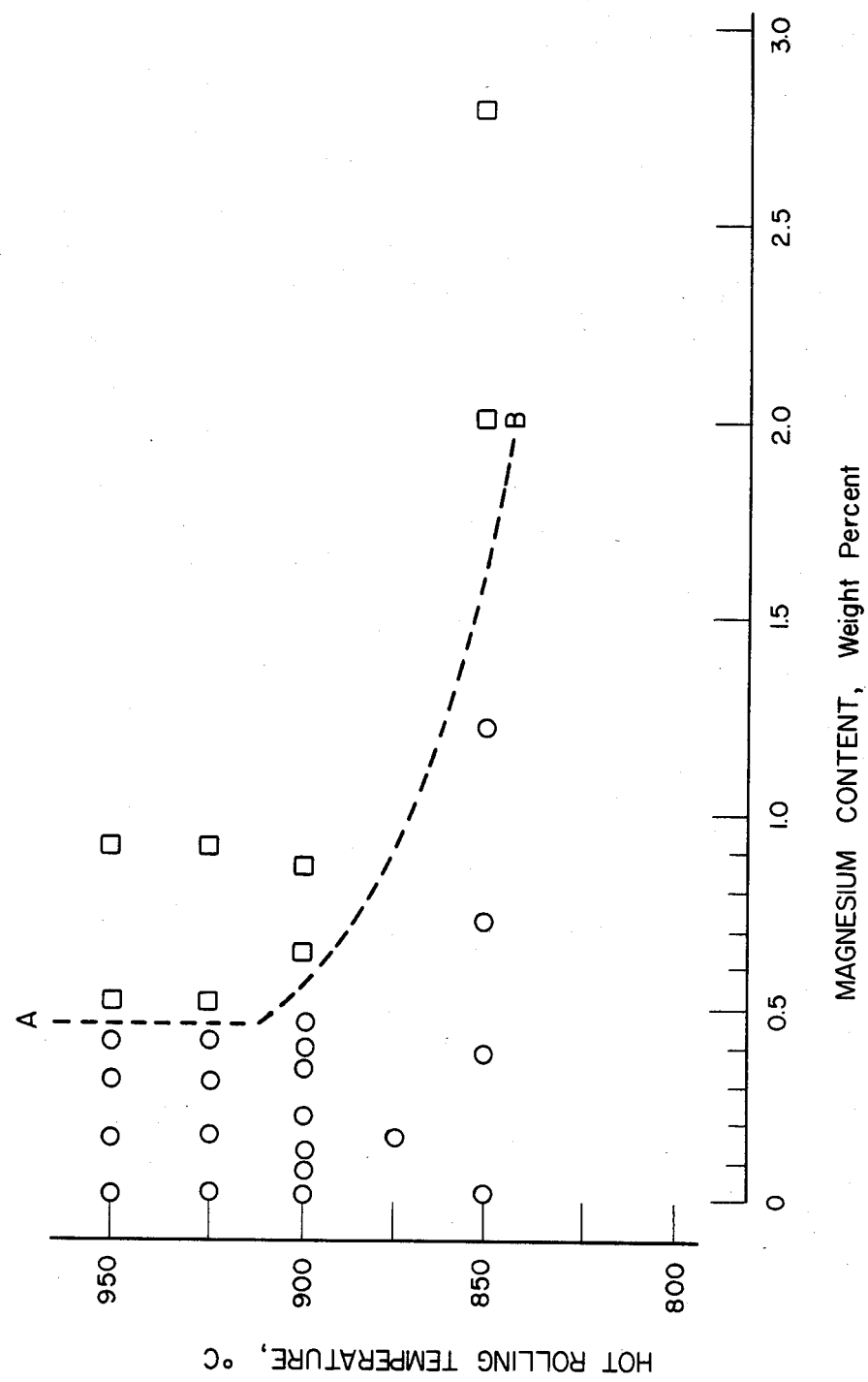

United States Patent [19]

Caron et al.

[11] Patent Number: 4,594,221
[45] Date of Patent: Jun. 10, 1986

[54] MULTIPURPOSE COPPER ALLOYS WITH MODERATE CONDUCTIVITY AND HIGH STRENGTH

[75] Inventors: Ronald N. Caron, Branford; John F. Breedis, Trumbull, both of Conn.

[73] Assignee: Olin Corporation, New Haven, Conn.

[21] Appl. No.: 727,463

[22] Filed: Apr. 26, 1985

[51] Int. Cl.$^4$ .............................................. C22C 9/06
[52] U.S. Cl. ................................... 420/485; 420/488; 420/490; 420/494; 148/3; 148/11.5 C; 148/127 C
[58] Field of Search ................. 420/485, 488, 490, 494

[56] References Cited

U.S. PATENT DOCUMENTS

| | | | |
|---|---|---|---|
| 1,658,186 | 2/1928 | Corson | 148/160 |
| 1,778,668 | 10/1930 | Fuller | 420/485 |
| 1,988,153 | 1/1935 | Bolton | 420/485 |
| 2,069,906 | 2/1937 | Vaders | 420/485 |
| 2,137,282 | 11/1938 | Hensel et al. | 420/485 |
| 2,157,934 | 5/1939 | Hensel et al. | 420/485 |
| 2,185,958 | 1/1940 | Strang et al. | 420/485 |
| 2,851,353 | 9/1958 | Roach et al. | 420/485 |
| 3,072,508 | 1/1963 | Klement et al. | 148/160 |
| 4,191,601 | 3/1980 | Edens et al. | 148/160 |
| 4,233,068 | 11/1980 | Smith et al. | 148/11.5 C |
| 4,233,069 | 11/1980 | Smith et al. | 148/11.5 C |
| 4,260,435 | 4/1981 | Edens et al. | 148/32.5 |
| 4,366,117 | 12/1982 | Tsuji | 420/481 |
| 4,434,016 | 2/1984 | Saleh et al. | 420/486 |
| 4,466,939 | 8/1984 | Kim et al. | 420/485 |

FOREIGN PATENT DOCUMENTS 213847 1/1983 Japan .

OTHER PUBLICATIONS

Brochure entitled "High Strength, High Conductivity Copper Alloys for IC Lead Frame", published by Sumitomo Metal Mining Copper & Brass Sales Co., Ltd.
Brochure by Penn Precision Products, Inc., Manufactures a Nickel-Silicon-Bronze Under Trademark Dickalloy.
Publication "Studies on Age Hardening Cu-Ni-Si-Mg and Cu-Ni-Si-Cr Alloys" by Bhargava et al., Z. Metallkde., Bd. 63 (1972) H.3, pp. 155 through 157.
Publication "Effects of Small Alloying Additions on the Ageing Behaviour of a Copper-Nickel-Silicon Alloy" by Tewari et al., Transactions of the Institute of Metals, Dec., 1964, pp. 211 through 216.

Primary Examiner—Veronica O'Keefe
Attorney, Agent, or Firm—Paul Weinstein; Howard M. Cohn; Barry L. Kelmachter

[57] ABSTRACT

A multipurpose copper base alloy having an improved combination of ultimate tensile strength and electrical conductivity. The alloy can be tailored for applications such as in connectors or leadframes by processing. The alloy may be processed to provide improved bead formability at some sacrifice in strength. The alloy in the stabilized condition shows surprising improvement in stress relaxation resistance. The alloy comprises a Cu-Ni-Si alloy to which about 0.05 to about 0.45% by weight magnesium is added.

16 Claims, 2 Drawing Figures

MULTIPURPOSE COPPER ALLOYS WITH MODERATE CONDUCTIVITY AND HIGH STRENGTH

This invention relates to copper base alloys having particular application in the electronics industry as leadframe or connector materials. The electronics industry is increasingly demanding higher strength leadframe alloys with good formability electrical and thermal conductivities. Likewise, connector applications would benefit from such alloys, if they can be provided with good stress relaxation resistance. The alloys of the present invention provide a combination of high strength and moderate to high conductivity properties, which are improved as compared to commercially available alloys.

A comparison of various copper alloys finding application in the electronics industry are set forth in a brochure entitled "High Strength, High Conductivity Copper Alloys For IC Lead Frame", published by Sumitomo Metal Mining Copper & Brass Sales Co., Ltd. It will be apparent from the following description that the alloys of the present invention provide a significant improved combination of strength and conductivity, as compared to many commercially available alloys.

It is highly desirable to provide a copper alloy in the aforenoted applications having a tensile strength of about 100 ksi or higher while maintaining an electrical conductivity of about 40% IACS or higher for a leadframe material. From the materials set forth in the brochure, only 42 Alloy achieves such a strength target, however, the conductivity of the alloy is extremely low. Of the moderate conductivity alloys, Alloy C19500 most closely approaches the desired properties, however, it fails to meet the strength target.

Certain beryllium-copper alloys, such as Alloy C17400 provide good conductivity and strength at a sacrifice in bend properties and at a cost penalty.

For connector applications in addition to strength and conductivity, stress relaxation resistance is an important property. The alloys in accordance with the present invention provide improved combinations of bend properties, conductivity and stress relaxation resistance as compared to a typical commercial alloy, such as Alloy C51000, which is a phosphor-bronze.

The alloys of the present invention are precipitation hardenable nickel-silicon-bronzes to which magnesium is added to provide the uniquely improved combination of properties. Numerous alloys and/or processes have been described in patents and the literature utilizing the precipitation hardening characteristics provided by the addition of nickel and silicon as, for example, those set forth in U.S. Pat. Nos. 1,658,186 to Corson, 1,778,668 to Fuller and 2,185,958 to Strang et al. Various additions of other elements to nickel-silicon-bronzes are described in U.S. Pat. Nos. 2,137,282 to Hensel et al., 3,072,508 to Klement et al., 4,191,601 to Edens et al., 4,260,435 to Edens et al., 4,466,939 to Kim et al. and in Japanese Laid-Open Patent Application No. 213,847/83 to Miyafuji et al. Penn Precision Products, Inc. manufactures a nickel-silicon-bronze under the trademark DICKALLOY. As set forth in their product brochure, that alloy comprises copper-nickel-silicon with additions of aluminum and chromium.

The assignee of the present invention also is the owner of patents relating to copper base alloys with magnesium additions which improve stress relaxation resistance. Those patents comprise U.S. Pat. Nos. 4,233,068 and 4,233,069 to Smith et al. which relate to brass alloys and U.S. Pat. No. 4,434,016 to Saleh et al. which relates to copper-nickel-aluminum alloys. U.S. patent application Ser. No. 645,957 to Knorr et al. discloses copper base alloys for leadframe or connector applications which include iron, magnesium, phosphorus and optionally tin.

Nickel-silicon-bronzes with additions of magnesium are disclosed in U.S. Pat. Nos. 2,851,353 to Roach et al. and 4,366,117 to Tsuji. The alloys contemplated by these patents fall outside the ranges of the present alloys in one or more respects.

U.S. Pat. No. 2,157,934 to Hensel and Larsen describes a copper base alloy which is age hardenable and comprises magnesium 0.1 to 3%, a material from the group nickel, cobalt or iron 0.1 to 5%, silicon 0.1 to 3% and the balance copper. The alloy is processed by heating it to a temperature above 700° C. followed by quenching and then aging below 700° C. If desired, the material can be cold worked between quenching and aging to increase its hardness.

The effects of small alloying additions of aluminum, magnesium, manganese and chromium on the aging behavior of a Cu-Ni-Si alloy containing 1.8% nickel and 0.8% silicon balance copper have been described in the publication "Effects Of Small Alloying Additions On the Ageing Behaviour Of A Copper-Nickel-Silicon Alloy" by Tewari et al. appearing in Transactions of the Indian Institute of Metals, December, 1964, Pages 211 through 216. The magnesium contents investigated varied from 0.2% to 1%. Copper-nickel-silicon-magnesium alloys, in particular, comprising 1.8% nickel, 0.8% silicon, with 0.3% magnesium or chromium are described in the publication "Studies on Age Hardening Cu-Ni-Si-Mg and Cu-Ni-Si-C r Alloys" by Bhargava et al. appearing in Z. Metallkde., Bd. 63 (1972) H. 3, Pages 155 through 157. This publication describes the age hardening behavior of such an alloy. It should be noted that the nickel content of the alloys investigated in these publications is outside the range of the present invention.

In accordance with the present invention, copper base alloys are provided having moderate to high conductivity with exceptionally good strength properties. The alloys can be processed in various manners to provide the best combinations of strength, bend formability and conductivity for the respective application. For leadframe applications, the alloys are generally processed to provide the best combinations of strength and conductivity as well as for good bend properties; whereas, for connector applications strength and resistance to stress relaxation are of paramount importance. For some connector applications, reduced strength with improved conductivity and bend performance are required.

These improved properties are achieved with a copper base alloy consisting essentially of from about 2 to about 4.8% by weight nickel, from about 0.2 to about 1.4% by weight silicon, from about 0.05 to about 0.45% by weight magnesium and the balance copper. Preferably, the alloy consists essentially of from about 2.4 to about 4.0% by weight nickel, from about 0.3 to about 1.1% by weight silicon and from about 0.05 to about 0.3% by weight magnesium and the balance copper. Most preferably, the magnesium is from about 0.1 to about 0.2% by weight. For leadframe applications, the alloys are preferably in the overaged condition. For connector applications, the alloys are preferably in the stabilized condition.

Various other elements can be added in minor amounts, which do not adversely affect the properties of the alloys.

The processing of the alloys in part determines their combination of strength, conductivity, bend formability and stress relaxation properties and their suitability for application as a leadframe or connector material.

Generally, the alloys are cast using direct chill casting. Thereafter, the alloys are hot rolled at a temperature from about 750° to 950° C. and, preferably, from about 850° to 900° C.

If desired, the alloys after the aforenoted processing, may be optionally homogenization annealed at a temperature of from about 550° to 700° C. If an homogenization anneal is employed in the process, the alloy should be resolutionized by annealing at a temperature in excess of 750° C. followed by quenching prior to any aging treatments. The homogenization anneal can be carried out after hot working or after an initial cold working, as desired.

In a first process alternative, the alloy is then subjected to one or more sequences of cold rolling and aging. Cold rolling in the first such sequence should comprise at least about 30% reduction in thickness and, preferably, at least about 50%. For connector applications requiring the highest strength properties at some sacrifice in bend formability, the alloys are then aged at a temperature from about 350° to about 500° C. and, preferably, from about 425° to about 480° C. If a second sequence of cold rolling and aging is required, the cold rolling should comprise at least about 10% reduction in thickness and, preferably, at least about 30% reduction in thickness and this should be followed by an aging treatment at a temperature lower than the aging in the first treatment generally ranging from about 350° to about 490° C. The alloy is then finally cold reduced from about 10 to about 90% reduction in thickness and, preferably, from about 30 to about 60%. Thereafter, for connector applications, the alloy is optionally stabilized by annealing at a temperature of from about 200° to 345° C. and, preferably, from about 225° to 330° C.

In a second process alternative, for leadframe applications, the processing following hot working or homogenization annealing comprises cold working the alloy at least about 30% and, preferably, at least about 50% reduction in thickness followed by annealing at a temperature of from about 750° to about 900° C. and, preferably, from about 800° to 850° C. and quenched followed by cold working at least about 10% and, preferably, at least about 30% followed by overaging at a temperature from about 500° to about 700° C. and, preferably, from about 510° to about 575° C. followed by cold rolling from about 10 to about 90% and, preferably, from about 30 to about 60% reduction in thickness. Although this process is designed for leadframe applications, should the alloy be desired for use in connector applications it may be optionally stabilized, as in the previous first process alternative. The second process alternative is believed to be broadly applicable to copper alloys consisting from about 0.05 to about 5.0% by weight nickel, from about 0.01 to about 2.0% by weight silicon, up to about 1% by weight magnesium and the balance copper. Other elements and impurities may be present, which do not substantially adversely affect the properties of the alloy. However, it is preferably applied to alloys in accordance with this invention.

Finally, in a third process alternative, the alloy may be treated by a process which adapts it for use alternatively as a leadframe or connector material having relatively high strength, moderate conductivity and somewhat poorer bend properties than the second process alternative but substantially better bend properties than the first process alternative. This process is the same as the second process alternative with the substitution of a non-overaging anneal for the overaging anneal. In accordance with this process the anneal prior to final reduction is carried out at a temperature of from about 350° to less than about 500° C. and, preferably, from about 425° to 480° C. The final cold reduction would be the same as in the previous processes and for connector applications an optional stabilization anneal, as previously described, is preferred.

Accordingly, there has been provided in accordance with this invention a multipurpose copper base alloy having a unique combination of strength, conductivity, bend formability and optionally stress relaxation resistance, which adapts the alloy for use as a connector or leadframe material.

It has been found that the alloys of this invention having a critical addition of magnesium can be readily tailored for either of these applications by appropriately adjusting their processing.

It has surprisingly been found that the alloys of this invention in the overaged condition provide substantial improvements in bend formability while maintaining relatively high strength and good conductivity properties.

It has also been surprisingly found that the stress relaxation resistance of the alloy is markedly affected by the use of a stabilization anneal.

It has surprisingly been found that the hot workability of the alloy can be improved by critically controlling the magnesium content within limits of this invention. If high magnesium contents are employed, the alloys develop a susceptibility to cracking, which is dependent on the hot working temperature. However, by maintaining the magnesium within the limits of this invention, this susceptibility to cracking is avoided irrespective of hot working temperature.

Accordingly, it is an advantage of the present invention to provide a multipurpose copper base alloy for electronic applications such as leadframes or connectors and the processing therefor.

It is a further advantage of this invention to provide such alloys having an improved combination of strength, conductivity, bend formability and optionally stress relaxation resistance.

It is a still further advantage of this invention to provide such alloys which are readily hot workable and which do not develop a temperature sensitive cracking susceptibility during hot work.

These and other advantages will become more apparent from the following description and drawings.

Figure 2:
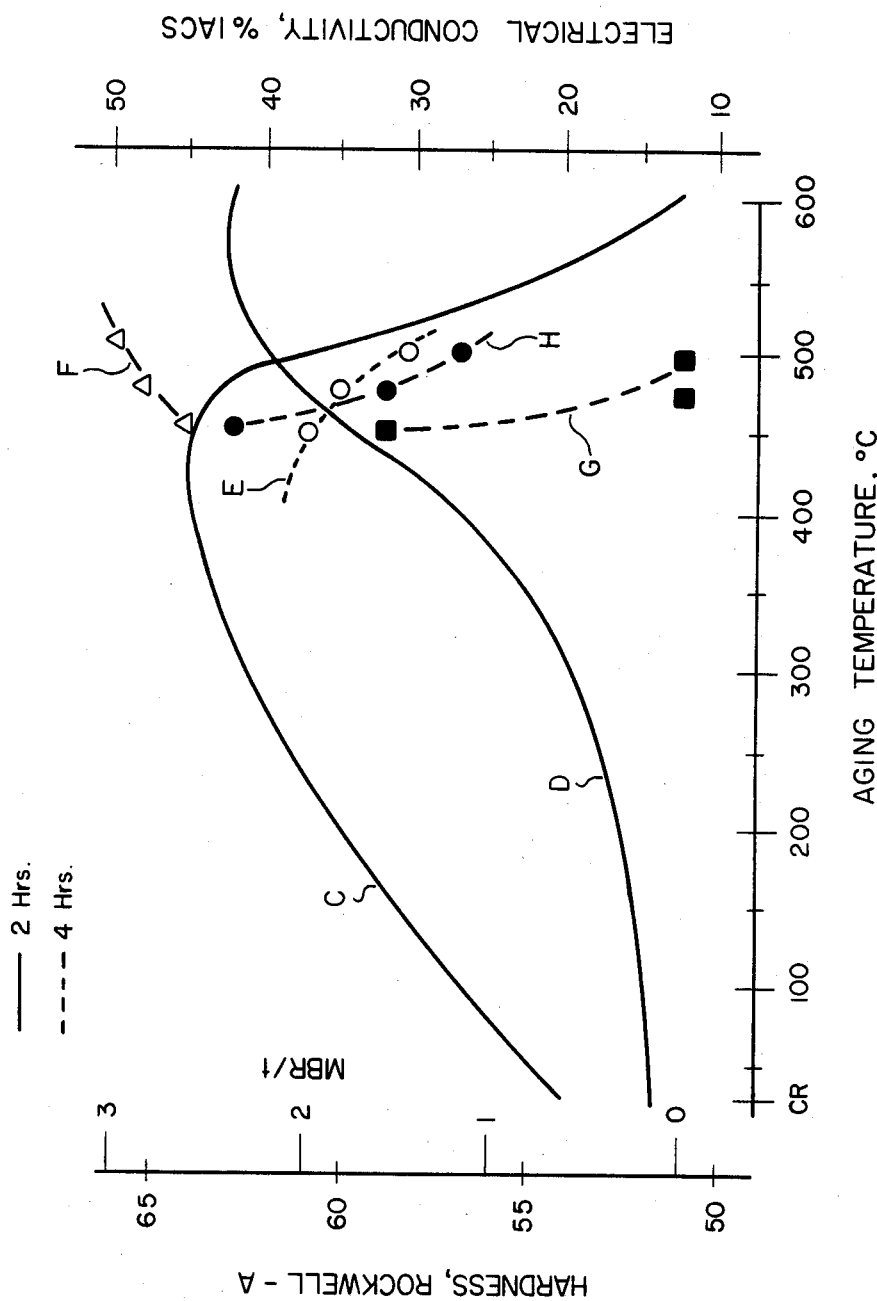

FIG. 1 is a graph showing the relationship between magnesium content and the temperature sensitive susceptibility of the alloy to cracking during hot working; and FIG. 2 is a graph showing the relationship between aging temperature and hardness, bend formability and electrical conductivity of the alloy at different aging times.

In accordance with this invention, a multipurpose copper base alloy is provided which depending on its processing can be effectively utilized as a leadframe or connector material by the electronics industry. The alloy is unique in that it provides an overall combination of properties superior to those available from alloys now generally commercially available. In the past, to achieve similar properties would have required the use of expensive beryllium-copper type alloys.

The alloys of this invention provide very high strengths at moderate conductivities. For example, they are capable of achieving strengths comparable to Alloy 42 with substantially better conductivity. They are also capable of achieving conductivities comparable to commercially available, moderate conductivity alloys with a substantial improvement in tensile strength.

By suitably adjusting the processing, the alloys may be configured for connector applications. For example, in applications such as flat spring connectors, the alloys can be processed to provide ultimate tensile strengths in excess of 130 ksi, while maintaining a conductivity in excess of 35% IACS. For connector or leadframe applications requiring high strength and good bend formability, the alloys can be processed to provide ultimate tensile strengths in excess of 115 ksi with an electrical conductivity of approximately 40% IACS or more. Finally, for leadframe and other applications requiring even better bend formability, the alloys can be processed in a manner to provide ultimate tensile strengths in excess of 100 ksi and electrical conductivity in excess of 45% IACS.

Accordingly, it is apparent that in accordance with this invention an alloy falling within given ranges of composition can be uniquely processed to meet a range of mechanical properties so that it can be tailored to a number of different applications. The ultimate tensile strength of the alloy can be emphasized with some degradation of bend and electrical conductivity properties. Alternatively, the bend properties can be emphasized while providing good conductivity at some loss of ultimate tensile strength.

For connector or other applications, the alloys can be processed to provide excellent stress relaxation resistance properties.

The multipurpose copper base alloys of this invention comprise alloys within the following critical ranges of composition. Namely, copper base alloys consisting essentially of from about 2 to about 4.8% by weight nickel, from about 0.2 to about 1.4% by weight silicon, from about 0.05 to about 0.45% by weight magnesium and the balance copper.

Preferably, the copper base alloy consists essentially of from about 2.4 to about 4.0% by weight nickel, from about 0.3 to about 1.1% by weight silicon, from about 0.05 to about 0.3% by weight magnesium and the balance copper. Most preferably, the magnesium is from about 0.1 to about 0.2% by weight.

Preferably, the ratio of nickel to silicon in the alloy ranges from about 3.5:1 to about 4.5:1 and, most preferably, the ratio of nickel to silicon ranges from about 3.8:1 to about 4.3:1.

For leadframe applications, the alloys are preferably in an overaged condition. For connector applications, the alloys are preferably in a stabilized condition.

Other elements and impurities may be included in the alloys which do not substantially adversely affect their properties.

Silicide forming elements such as chromium, cobalt, iron, titanium, zirconium, hafnium, niobium, tantalum, mischmetal (lanthanides) and mixtures thereof may be present in an effective amount for forming a silicide up to about 1% by weight. Where such elements are present, they should be in substitution for a comparable portion of the nickel content. Preferably, chromium should be limited to an amount not to exceed about 0.1% by weight.

The alloys of this invention may also include one or more deoxidizing and/or desulfurizing elements selected from lithium, calcium, manganese mischmetal and mixtures thereof in an effective amount for deoxidizing or desulfurizing up to about 0.25% by weight.

The lower limits for nickel and silicon in the alloy of this invention are required for achieving the desired strength of the alloy. If nickel or silicon are present in excess of the amounts set forth, they become difficult to solutionize in the alloy. The range of magnesium is critical to the hot workability of the alloy and to its cold rollability.

Referring to FIG. 1, there is shown a graph relating magnesium content of the alloy to hot rolling temperature. The zone below and to the left of the dashed line AB is acceptable for hot rolling purposes. The zone above and to the right of the line AB is unacceptable due to cracking of the ingots during hot rolling. It is apparent from a consideration of FIG. 1 that there is a hot rolling temperature sensitivity for the alloys of this invention if the magnesium content exceeds 0.45% by weight. Within the limits of this invention, below 0.45% by weight magnesium the alloy is insensitive to hot working temperature and is readily hot workable over a wide range of hot working temperatures.

This susceptibility to cracking at elevated hot working temperatures was not in any way foreseen by Hensel and Larson in U.S. Pat. No. 2,157,934. The range of magnesium set forth in the Hensel and Larson patent goes up to 3% by weight. A consideration of FIG. 1 clearly illustrates that only a small portion of this range as in accordance with this invention can be utilized so as to make the alloy insensitive from a cracking point of view to hot working temperature and, therefore, make it readily hot workable.

The lower limit of magnesium is important for achieving the desired mechanical properties of the alloys of this invention, in particular, for achieving the improved stress relaxation resistance of these alloys. Magnesium is also believed to improve the cleanability of the allows.

The magnesium content should also be controlled within the limits of the present invention so as to reduce the occurrence of edge cracking during cold working. The effect of the magnesium content on edge cracking during cold rolling of alloys processed in accordance with different processes and for a range of magnesium contents is set forth in Table I.

TABLE I

EXTENT (inches) OF EDGE CRACKING DURING COLD ROLLING
OF Cu—3.6Ni—0.9Si—Mg ALLOYS AS A FUNCTION
OF MAGNESIUM CONTENT
(Initial rolling response/edge crack depth at 0.030″)**

| Processing* | 0 Mg | 0.15 Mg | 0.4 Mg | 0.7 Mg | 1.0 Mg |
|---|---|---|---|---|---|
| PROCESS I<br>Cast + 850° C.-1 hr + WQ<br>Cold Roll to 0.030″ | 0/0 | 0/0 | Cracking at 0.40″/0 | Cracking at 0.55″/1/16″ | Cracking at 0.57″/3/32″ |
| PROCESS II<br>Cast + CR 50% +<br>850° C.-1 hr + WQ +<br>Cold Roll to 0.030″ | 1/16″ Cracking at 0.265″/0 | 1/16″ Cracking at 0.295″/0 | ⅛″ Cracking at 0.53″/0 | ⅛″ Cracking at 0.44″/ initiation | ⅛″ Cracking at 0.44″/1/32″ |
| PROCESS III<br>Cast + HR (875° C.) +<br>Cold Roll to 0.030″ | 0/0 | 1/16″ Cracking at 0.15″/0 | 1/16″ Cracking at 0.15″/1/32″ | 1/16″ Cracking at 0.15″/1/32″ | ⅛″ Cracking at 0.38″/1/16″ |

CR = Cold Roll
HR = Hot Roll
WQ = Water Quench
*Cold rolled from 0.55″
**Edge trimming done by shearing at 0.10″; that is "/" separates behavior before and after shearing.

It is apparent from a consideration of Table I that maintaining the magnesium content within the range of this invention and particularly within the preferred limit provides markedly improved reduction in edge cracking during cold working particularly after edge trimming.

In Table I, the results shown before the slash mark under each magnesium content give the extent of the crack at a specific strip thickness with the starting thickness being 0.55″. The results shown following the slash mark are the extent of any cracks at final gauge as set forth in the processing column.

The alloys in accordance with this invention are processed differently depending on the mechanical properties which are desired, which in turn are determined by the ultimate application for which the alloys will be utilized. Connector alloys normally require high strength for spring properties and good stress relaxation resistance while maintaining sufficient electrical conductivity, thermal conductivity and formability. For those connector applications requiring excellent formability properties as well, the processing can be adjusted with a moderate impact on the strength properties. Finally, for leadframe applications where high bend formability and electrical conductivity are required, the processing can be further adjusted at some sacrifice in strength properties. The stress relaxation properties of the alloy which are important to connector type applications are very much influenced by the alloy processing and, in particular, it has surprisingly been found that the use of a stabilization anneal very beneficially affects the stress relaxation properties of these alloys.

The alloys of this invention may be cast in any desired manner by conventional means as, for example, Direct Chill casting. The casting temperature is preferably from at least about 1100° to about 1250° C. Where the alloy is cast as a slab or ingot, which is the preferred approach, it is then homogenized or soaked at a temperature of from about 850° to about 980° C. for about ½ to about 4 hrs. followed by hot working such as by hot rolling in a plurality of passes to a desired gauge generally less than about ¾″ and, preferably, ½″ or less. The alloys are preferably rapidly cooled after hot working, as by water quenching. Preferably, the hot working is adapted to solutionize the alloying elements.

While Direct Chill casting followed by hot working is a preferred process of this invention, it may be possible to cast the alloy in a strip form having a thickness of about 1″ or less. Obviously, if the alloys are cast in strip form, it is not necessary to hot roll them. The hot working process particularly when it is followed by water quenching should be adapted to solutionize the alloying elements and thereby eliminate the need for a solution anneal. However, if desired and particularly if the alloy is strip cast, the alloys may be optionally solutionized annealed at a temperature of from about 750° to about 950° C. for a period of from about 30 seconds to about 8 hours and, preferably, from about 1 minute to about 4 hours followed by rapid cooling, which is preferably water quenching.

After hot working or strip casting, the alloys are preferably milled to remove oxides and scale before further processing.

If desired, the alloys may be optionally homogenization annealed at a temperature of from about 550° to about 700° C. for a period of from about 1 to about 8 hours. The homogenization anneal can be carried out after hot working or after an initial cold working such as cold rolling up to about 80% reduction in thickness and, preferably, from about 50 to 70% reduction. If the alloy is homogenization annealed, it is necessary to thereafter solution anneal the strip. Therefore, as part of the homogenization annealing treatment, the alloys are preferably solution annealed at a temperature of from about 750° to about 950° C. for a period of from about 30 seconds to about 8 hours and, preferably, from about 1 minute to about 4 hours. Immediately following annealing the alloys are rapidly cooled preferably by water quenching. Strip annealing because of the ease of water quenching is the preferred method for solution annealing.

After hot rolling or homogenization annealing, as the case may be, the alloy is subjected to one or more sequences of cold reduction and aging. Cold reduction is preferably carried out by cold rolling. The first sequence of cold rolling preferably comprises at least about a 30% reduction in thickness and, most preferably, at least about 50%.

PROCESS ALTERNATIVE 1

Processing for High Strength

Following the first sequence of cold reduction, the alloy is aged at a temperature of from about 350° to about 500° C. and, preferably, from about 425° to about 480° C. If further sequences of cold reduction and aging are desired, the cold rolling should comprise at least about a 10% reduction in thickness and, preferably, at least about 30% and this should be followed by an aging anneal at a temperature lower than the previous aging anneal with the annealing temperature being in the range of from about 350° to about 490° C.

The aging anneals should be for a period of from about ½ to 8 hours at temperature and, preferably, for a period of from about 2 to 4 hours.

Following the respective sequences of cold rolling and aging, the alloy is finally cold reduced by rolling it to provide a reduction of from about 10 to about 90% reduction in thickness and, preferably, from about 30 to about 60%.

The stress relaxation resistance properties of the alloys of this invention are markedly improved by the use of an optional stabilization anneal at a temperature of from about 200 to about 345° C. and, preferably, from about 225° to about 330° C. for a period of from about ½ to about 8 hours and, preferably from about 1 to about 2 hours.

PROCESS ALTERNATIVE 2

Processing For Best Bend Formability

The alloys after hot working or homogenization annealing treatment are subjected to a first sequence of cold working preferably by cold rolling at least about 30% and, preferably, at least about a 50% reduction in thickness. The alloys are then resolutionized by annealing at a temperature of from about 750° to about 950° C. and, preferably, from about 800° to about 850° C. for a period of from about 30 seconds to about 8 hours and, preferably, from about 1 minute to 1 hour followed by rapid cooling preferably by water quenching. This anneal is preferably carried out as a strip anneal.

Optionally this first sequence of cold working and annealing may be repeated as a second sequence in order to reach a desired final gauge.

Thereafter, the alloys are cold worked by rolling at least about 10% and, preferably, at least about 30% reduction in thickness followed by overaging. The alloys are then subjected to an overaging treatment preferably comprising annealing the alloy at a temperature of from about 500° to about 700° C. and, preferably, from about 510° to about 575° C. for a period of from about ½ hour to about 8 hours and, preferably, for a period of from about 1 hour to about 4 hours. Thereafter, the alloys are generally finally cold reduced by cold rolling from about 10 to about 90% and, preferably, from about 30 to about 60% reduction in thickness.

While this process alternative is particularly adapted for providing alloys for leadframe applications, it may be utilized for connector alloys in which case the previously described optional stabilization treatment is preferably carried out.

This second process alternative is believed to be broadly applicable to copper alloys consisting essentially of from about 0.05 to about 5.0% by weight nickel, from about 0.01 to about 2.0% by weight silicon, up to about 1% by weight magnesium and the balance copper. Other elements and impurities may be present which do not substantially adversely affect the properties of the alloy. However, it is preferably applied to alloys in accordance with this invention.

PROCESS ALTERNATIVE 3

Processing for Strength and Bend Properties Intermediate Alternatives 1 and 2

This process provides copper alloys for use alternatively as leadframe or connector materials having relatively high strength, moderate conductivity and somewhat poorer bend properties than Alternative 2. The process is essentially the same as that described by reference to Alternative 2 except that an aging anneal is substituted for the overaging anneal. In accordance with this process, the final aging anneal prior to the final reduction is carried out at a temperature of from about 350° to less than about 500° C. and, preferably, from about 425° to about 480° C. for a period of from about ½ to about 8 hours and, preferably, from about 1 to about 4 hours. The alloy is then finally cold reduced from about 10 to about 90% and, preferably, from about 30 to about 60%. If the alloy is intended for connector applications, it is preferably stabilization annealed as in accordance with the aforenoted stabilization process set forth under Process Alternative 1.

The optional stabilization anneal in accordance with this invention can be carried out after final reduction or after forming of the final part, as desired. For manufacturing convenience, it is most easily carried out after final reduction. However, it is believed that the best stress relaxation results are obtained if the stabilization treatment is carried out after final forming since forming the alloy after it has been stabilization annealed may reduce the stress relaxation properties to a degree.

Referring to FIG. 2, a graph is shown which illustrates the relationship between aging temperature and hardness, bend formability and electrical conductivity of the alloys of this invention at different aging times.

In FIG. 2, solid curve C represents the hardness of a Cu—4.0%Ni—0.98%Si—0.18%Mg alloy aged for 2 hours at the respective aging temperatures. Solid curve D shows the electrical conductivity of those alloys over the range of aging temperatures. Dashed curve E shows the affect of aging such alloys for 4 hours on hardness and dashed curve F shows the affect of aging the alloys for 4 hours on electrical conductivity. The respective curves G and H show the good way and bad way bend properties for the alloys aged 4 hours. The results, which are depicted in FIG. 2, are for the alloys in the aged condition.

It is apparent from a consideration of FIG. 2 that an aging temperature of 450° C. provides a peak aging response; whereas, temperatures exceeding 480° C. and, preferably, exceeding 500° C. provide an overaged condition. It is significant and surprising that it is possible to overage the alloy while maintaining a relatively high strength level. It is also apparent from a consideration of FIG. 2 that the bend properties and electrical conductivity are markedly improved by overaging as compared to aging for peak hardening response.

A consideration of FIG. 2 shows that Process Alternative 1 will yield a generally peak aged product; whereas, Process Alternative 2 will yield an overaged product. Process Alternative 3 lies somewhere between those two.

In FIG. 2, the bend properties are set forth as minimum bend radius divided by the thickness of the strip. The bend formability test measures the minimum radius to a strip can be bent 90° without cracking. The good way or longitudinal orientation bend properties are measured with the bend axis perpendicular to the rolling direction. The bad way or transverse orientation bend properties are measured with the bend axis parallel to the rolling direction. The minimum bend radius (MBR) is the smallest die radius about which the strip can be bent 90° without cracking and "t" is the thickness of the strip.

In FIG. 2, the curve G is for good way or longitudinal orientation bends; whereas, the curve H is for bad way or transverse orientation bends.

While the discussion thus far has been in terms of electrical conductivity, it should be apparent that the electrical applications for which the alloys of the present invention are intended also desire good thermal conductivity, which is physically related to the electrical conductivity of the alloy.

The alloy may be optionally cleaned by conventional pickling solutions as desired such as after annealing.

The present invention will be more readily understandable from a consideration of the following illustrative examples.

EXAMPLE I

An alloy having a composition: 3.03% nickel, 0.71% silicon, 0.17% magnesium and the balance copper was prepared by Direct Chill casting a 6"×30" cross section ingot from a melt temperature of about 1100° C. 2"×2"×4" samples cut from the ingot were soaked for 2 hours at 875° C. and hot rolled to a thickness of 0.55" in 6 passes. The alloys were then milled to 0.45" gauge. Thereafter, the ingots were cold rolled to 0.10" and aged by annealing at 475° C. for 2 hours. Thereafter, the alloys were cold rolled to 0.050" and again aged at 400° C. for 2 hours. The alloys were then cold rolled to 0.030" and stabilization annealed at 300° C. for 1 hour. The mechanical properties of the alloys were measured after the final cold rolling and after the stabilization anneal. The properties which were measured are set forth in Table II.

TABLE II

| | PROPERTIES OF Cu—3.03Ni—0.71Si—0.17Mg AT 0.030" GAUGE | | | | | | |
|---|---|---|---|---|---|---|---|
| Condition Process ALT 1 | Electrical Conductivity, % IACS | 0.2 YS ksi | UTS ksi | Elong. % | MBR/t GW | MBR/t BW | Stress Remaining* At 100,000 hours Percent |
| Final CR 40% | 36.6 | 128 | 139 | 2 | 3.6 | 16 | 64.1 |
| 300° C.-1 hr | 38.7 | 132 | 141 | 2 | 4.2 | 16 | 88.8 |

*Initial stress at 80% of yield strength. 1000 hr data extrapolated to 100,000 hrs. Tested at 105° C.

It is apparent from a consideration of Table II that when the alloys of this invention are processed in accordance with Process Alternative 1 very high ultimate tensile strengths are obtained at moderate electrical conductivity. However, there is a notable sacrifice in bend formability properties. The stress relaxation properties of the alloys are markedly improved by the stabilization anneal as shown by the comparison of 88.8% stress remaining after stabilization versus 64.1% of stress remaining from an unstabilized alloy. The excellent strength and conductivity properties of this alloy combined with the significant stress relaxation resistance in the stabilized condition make it highly useful in connector applications such as flat spring type devices. Accordingly, Process Alternative 1 is clearly adapted to providing alloys in accordance with this invention having very high strength at moderate conductivity with excellent stress relaxation resistance in the stabilized condition.

EXAMPLE II

A series of alloys were prepared having the compositions as set forth in Table III. The alloys are processed as set forth in Table III.

TABLE III

| 105° C. STRESS RELAXATION DATA AS A FUNCTION OF MAGNESIUM CONTENT | | | | | | |
|---|---|---|---|---|---|---|
| | | | | Finally Cold Rolled | | Stabilized (300° C.-1 hr) |
| Process | Ni | Si | Mg | 0.2 YS ksi | Stress Rem. % | 0.2 YS ksi / Stress Remaining* At 100,000 hours Percent |
| A | 2.98 | 0.72 | 0 | 108 | 59.4 | 105 / 69.2 |
| A | 3.08 | 0.76 | 0.14 | 126 | 61.4 | 130 / 86.2 |
| B | 3.03 | 0.71 | 0.17 | 106 | 60.9 | 98 / 92.2 |
| C | 4.10 | 0.84 | 0.45 | 94 | 54.0 | 89 / 85.0 |
| D | 3.10 | 0.78 | 1.06 | 140 | 58.4 | 145 / 91.7 |

*Initial stress at 80% of yield strength. 1000 hr. data extrapolated to 100,000 hrs. Tested at 105° C.

Processes:
A = CR to 0.16" + A @ 475° C. - 2 hrs. + CR to 0.080" + A @ 400° C. - 2 hrs. + CR to 0.020"
B = CR to 0.10" + A @ 525° C. - 4 hrs. + CR to 0.050" + A @ 425° C. - 4 hrs. + CR to 0.030"
C = CR to 0.18" + A @ 550° C. - 4 hrs. + CR to 0.080" + A @ 425° C. - 4 hrs. + CR to 0.040"
D = CR to 0.16" + A @ 425° C. - 2 hrs. + CR to 0.080" = A @ 350° C. - 2 hrs. + CR to 0.020"

The alloys set forth in Table III have varying magnesium contents. The stress relaxation resistance of the alloys was measured after final cold rolling and after further stabilization annealing. The data set forth in Table III clearly establish the beneficial effect of magnesium on the stress relaxation resistance of these alloys over a wide range of magnesium content. The data further establishes the clearly significant improvement in stress relaxation resistance which is obtained by stabilization annealing the alloys. Therefore, it is preferred in accordance with the present invention for connector or other applications where stress relaxation resistance is desired to utilize the alloys in the stabilized condition.

EXAMPLE III

Samples from Example I after hot rolling were subjected to the following processing sequences. Following hot rolling, the alloys were cold rolled to 0.15". The alloys were then given an homogenization treatment comprising annealing at 600° C. for 6 hours; cold rolling to 0.10", annealing at 830° C. for 4½ minutes followed by water quenching. Following the homogenization treatment the alloys were cold rolled to 0.030" and then annealed at 830° C. for 4½ minutes followed by water quenching and then cold rolled to 0.015". A portion of the alloys as cold rolled to 0.015" were given an overaging anneal at 525° C. for 4 hours followed by cold rolling to 0.010". This processing is in accordance with Process Alternative 2. A further portion of these alloys were then given an aging anneal at 475° C. for 2 hours followed by cold rolling to 0.010". These alloys have been processed in accordance with Process Alternative 3. The properties of the alloys at 0.010" gauge are set forth in Table IV.

TABLE IV

PROPERTIES OF
Cu—3.03Ni—0.71Si—0.17Mg AT 0.010" GAUGE

| Process | Anneal at 0.015" | Conductivity % IACS | YS ksi | UTS ksi | Elong. % | MBR/t GW | MBR/t BW |
|---|---|---|---|---|---|---|---|
| ALT 2 | 525° C.-4 hrs | 46.1 | 98 | 101 | 1.5 | 1.2 | 1.6 |
| ALT 3 | 475° C.-2 hrs | 40.5 | 118 | 123 | 0.8 | 1.6 | 6.2 |

As shown in Table IV, Process Alternative 2 provides the highest electrical conductivity while maintaining excellent ultimate tensile strength in excess of 100 ksi and while providing excellent bend formability properties. This process is particularly suited for manufacturing materials having applications as leadframes where excellent bend formability as well as strength and conductivity properties are desired. While it is believed that the alloys processed by Process Alternative 2 will find their principal application as leadframes they could also be utilized for connector or other applications requiring the excellent bend formability properties. For connector applications, the alloys are preferably stabilization annealed in order to provide improved stress relaxation resistance. The results of Process Alternative 3 by comparison with the results of Process Alternative 2 and those previously set forth in Table II fall intermediate the other processes properties. Process Alternative 3 provides very good strength properties in excess of 120 ksi ultimate tensile strength and good conductivity in excess of 40% IACS at a penalty in bad way bends.

EXAMPLE IV

A series of alloys having the compositions set forth in Table V were prepared as follows: The alloys were melted at a temperature of about 1225° C. Each melt was poured into a steel mold resting on a water cooled copper plate. The resulting 2"×2"×4" chill cast ingots were soaked 2 hours at 900° C. and hot rolled from that temperature to a thickness of 0.55" in 6 passes. The alloys were then processed as follows. They were milled to 0.40" gauge and then cold rolled to 0.18" gauge. A portion of the alloys were annealed 4 hours at 500° C. followed by cold rolling to 0.080" gauge and then annealed 2 hours at 425° C. followed by cold rolling 75% to 0.020" gauge. The mechanical and electrical properties of the alloys were then measured and are set forth in Table V.

TABLE V

PROPERTIES AT 0.020" GAUGE

| Alloy (Bal. Cu) | 0.2% Yield Strength ksi | Tensile Strength ksi | Elongation % | Conductivity % IACS |
|---|---|---|---|---|
| 4Ni—1Si | 88 | 98 | 4 | 51 |
| 4Ni—1Si—0.1Mg | 124 | 138 | 2 | 44 |
| 4.7Ni—1.2Si—0.2Mg | 123 | 136 | 2 | 42 |
| 4.7Ni—1.2Si—0.1Cr—0.2Mg | 124 | 138 | 2 | 43 |
| 4Ni—1Si—0.1Mn—0.2Mg—0.05Cr | 120 | 135 | 4 | 42 |

Table V clearly illustrates the marked improvement in strength achievable with the alloys of the present invention without an unacceptable loss of electrical conductivity. The data in Table V also show that the alloys may include other elements such as chromium and manganese within the ranges of this invention without sacrificing the strength properties.

EXAMPLE V

A portion of the alloys of the previous example at 0.18" gauge were annealed at a temperature of 475° C. for 2 hours then cold rolled to 0.080" gauge and annealed at 400° C. for 2 hours followed by cold rolling 75% to 0.020" gauge. The mechanical and electrical properties of the alloys were measured and are listed in Table VI.

TABLE VI

PROPERTIES AT 0.020" GAUGE

| Alloy (Bal. Cu) | 0.2% Yield Strength ksi | Tensile Strength ksi | Elongation % | Conductivity % IACS |
|---|---|---|---|---|
| 4Ni—1Si | 102 | 116 | 4 | 48 |
| 4Ni—1Si—0.1Mg | 130 | 146 | 2 | 38 |
| 4.7Ni—1.2Si—0.2Mg | 128 | 146 | 1 | 41 |
| 4.7Ni—1.2Si—0.1Cr—0.2Mg | 138 | 153 | 1 | 36 |
| 4Ni—1Si—0.1Mn—0.2Mg—0.05Cr | 133 | 151 | 2 | 34 |

A consideration of Table VI shows that the alloys of this invention are capable of achieving exceptional levels of tensile strength while maintaining a moderate electrical conductivity. Table VI further shows that minor additions of chromium and/or manganese are beneficial to the tensile strength properties of the alloy while reducing the electrical conductivity to a degree.

In the present application "Yield Strength" comprises yield strength measured at 0.2% offset. "UTS" comprises ultimate tensile strength. "Elongation" in accordance with this invention is measured in a 2" gauge length. The term "ksi" is an abbreviation for thousands of pounds per square inch. All compositional percentages are in percent by weight. All annealing times are times at temperature and do not include the furnace time getting up to temperature and cooling down. Strip anneals are preferred in accordance with this invention for solution annealing or resolutionizing the alloy. Anneals which can be carried out in periods of less than 10 minutes are preferably performed by strip annealing techniques. Anneals in excess of such a period are preferably carried out by Bell annealing.

The commercial copper alloy designations set forth in this application comprise standard designations of the Copper Development Association Incorporated, 405 Lexington Avenue, New York, N.Y. 10017.

The patents, patent application and publications set forth in this specification are intended to be incorporated by reference herein.

It is apparent that there has been provided in accordance with this invention multipurpose copper alloys and processing therefor with moderate conductivity and high strength which fully satisfy the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

We claim:

1. A copper base alloy having an improved combination of ultimate tensile strength and electrical conductivity consisting essentially of from about 2 to about 4.8% by weight nickel, from about 0.2 to about 1.4% by weight silicon, from about 0.05 to about 0.45% by weight magnesium and the balance copper.

2. A copper base alloy as in claim 1 consisting essentially of from about 2.4 to about 4.0% by weight nickel, from about 0.3 to about 1.1% by weight silicon, from about 0.05 to about 0.3% by weight magnesium and the balance copper.

3. A copper base alloy as in claim 1 comprising a leadframe having good bend formability and wherein said alloy is in an overaged condition.

4. A copper base alloy as in claim 1 wherein said alloy comprises an electrical connector having good stress relaxation properties and wherein said alloy is in a stabilized condition.

5. A copper base alloy as in claim 1 wherein the ratio of nickel to silicon in said alloy ranges from about 3.5:1 to about 4.5:1.

6. A copper base alloy as in claim 5 wherein said ratio ranges from about 3.8:1 to about 4.3:1.

7. A copper base alloy as in claim 2 comprising a leadframe having good bend formability and wherein said alloy is in an overaged condition.

8. A copper base alloy as in claim 2 wherein said alloy comprises an electrical connector having good stress relaxation properties and wherein said alloy is in a stabilized condition.

9. A copper base alloy as in claim 2 further including an effective amount up to about 1% by weight of a silicide forming element selected from the group consisting of chromium, cobalt, iron, titanium, zirconium, hafnium, niobium, tantalum, mischmetal and mixtures thereof and wherein the nickel content of said alloy is reduced by the amount of said silicide forming element.

10. A copper base alloy as in claim 9 further including an effective amount up to about 0.25% of a deoxidizing or desulfurizing element selected from the group consisting of lithium, calcium, manganese, mischmetal and mixtures thereof.

11. A copper base alloy as in claim 9 wherein when chromium is present it does not exceed about 0.1% by weight.

12. A copper base alloy as in claim 1 having improved bend formability, said alloy being in an overaged condition.

13. A copper base alloy as in claim 1 having improved stress relaxation resistance, said alloy being in a stabilized condition.

14. A copper base alloy as in claim 2 having improved bend formability, said alloy being in an overaged condition.

15. A copper base alloy as in claim 2 having improved stress relaxation resistance, said alloy being in a stabilized condition.

16. A copper base alloy as in claim 2 wherein said magnesium is from about 0.1 to about 0.2% by weight.

* * * * *